United States Patent [19]

Brandt et al.

[11] 4,002,246

[45] Jan. 11, 1977

[54] APPARATUS FOR HANDLING WORKPIECES SUCH AS SEMICONDUCTOR SUBSTRATES

[75] Inventors: Georg Brandt, Erlangen-Dechsendorf; Werner Kolar, Lauf, both of Germany

[73] Assignee: Georg Müller Kugellagerfabrik K.G., Germany

[22] Filed: Mar. 18, 1975

[21] Appl. No.: 559,432

[30] Foreign Application Priority Data

Oct. 30, 1974 Germany .......................... 2451549

[52] U.S. Cl. .................... 214/1 BH; 51/215 CP; 51/235

[51] Int. Cl.² .................... B25J 15/06; B24B 7/22

[58] Field of Search ............. 51/109 R, 131–133, 51/215 AR, 215 CP, 235; 214/1 BH, 1 BT, 1 BV, 1 BS, 1 BC

[56] References Cited

UNITED STATES PATENTS

| | | | |
|---|---|---|---|
| 3,272,350 | 9/1966 | Pflaumer et al. | 214/1 BT |
| 3,437,096 | 4/1969 | Warren | 214/1 BV X |
| 3,601,243 | 8/1971 | Gurgacz | 214/1 BH X |
| 3,753,509 | 8/1973 | Kock | 214/1 BV X |
| 3,849,944 | 11/1974 | Noll | 51/235 X |
| 3,860,125 | 1/1975 | Johnson | 214/1 BH |

*Primary Examiner*—Al Lawrence Smith
*Assistant Examiner*—Nicholas P. Godici
*Attorney, Agent, or Firm*—Steinberg & Blake

[57] ABSTRACT

Apparatus for handling delicate workpieces such as semiconductor substrates which have the configuration of small plates. The workpieces are preliminarily situated at predetermined locations in a positioning plane. Then, without changing their positions relative to each other, the workpieces are all simultaneously transferred away from the positioning plane while being maintained during transfer in a common plane which moves with the workpieces. During their transfer the workpieces are held by suction in this common plane by way of suitable suction nozzles which have at least at their ends which engage the workpieces a soft elastic material. This common plane in which the workpieces are situated during their transfer is brought into coincidence with a predetermined working plane at which the workpieces are deposited upon termination of the suction at the nozzles and application of a pressure greater than atmospheric pressure at the nozzles, and in the working plane the workpieces are situated at locations which have with respect to each other the same relationship as the locations of the workpieces at the positioning plane. All of the above planes are preferably horizontal and of course parallel to each other at all times.

6 Claims, 3 Drawing Figures

APPARATUS FOR HANDLING WORKPIECES SUCH AS SEMICONDUCTOR SUBSTRATES

BACKGROUND OF THE INVENTION

The present invention relates to apparatus for handling delicate workpieces.

Thus, the present invention relates to apparatus for handling workpieces such as semiconductor substrates having the configuration of relatively small plates, the handling of such workpieces being carried out in connection with transfer of a plurality of the workpieces simultaneously to a location such as a work station of a grinding machine, for example.

Semiconductor elements are extremely important and necessary components of modern electrical and electronic equipment. The use of such components in communications, processing of all types, data processing, radio and telephone installations, and above all in space travel leads continuously to further developments in these fields. Important examples of components of this type are transistors, diodes, integrated circuits, and solar elements.

Known semiconductor materials are germanium, silicon, ceramic oxides, sapphire, and compounds of indium and antimony, namely indiumantimonide, or compounds of gallium and arsenic, namely galliumarsenide.

The semiconductor material on which operations must be performed is in the form of a substrate or small thin plate, a so-called wafer, which is formed by sawing such a plate with a special tool from a single cylindrical crystal. Such semiconductor substrates are subjected to further operations such as grinding on one or both sides, or being subjected to treatments such as diffusion or radiation treatments and the like. The handling of these wafer-shaped round thin semiconductor substrates, which must be carried out with large numbers thereof, is accompanied by great difficulties because of the ease with which these workpieces are broken, and at the present time such workpieces are manually handled. These manual operations are extremely undesirable from the standpoint of economy, and even with the most experienced skillful manipulations nevertheless there are inevitably a large number of rejects resulting from breakage.

SUMMARY OF THE INVENTION

It is accordingly a primary object of the present invention to provide apparatus for avoiding the above drawbacks.

Thus, it is an object of the present invention to provide apparatus according to which it becomes possible to handle workpieces such as semiconductor substrates in such a way that with respect to manual operations there is a great saving of time as well as a great reduction in the number of rejects.

Thus, it is an object of the present invention to provide apparatus which make it possible to carry out operations simultaneously on a relatively large number of workpieces such as semiconductor substrates in such a way that great advantages are achieved as compared to conventional manual handling.

In particular, it is an object of the present invention to provide apparatus for transferring a plurality of workpieces of the above type simultaneously from one location to another in such a way that the workpieces will not be broken and will at the same time be accurately situated respectively at desired locations where operations will be performed on the workpieces.

Moreover, it is an object of the invention to provide apparatus capable not only of safely handling delicate workpieces of the above type but also capable of compensating for variations in dimensions such as the thickness of the workpieces.

Yet another object of the present invention is to provide apparatus according to which it is possible to transfer a plurality of workpieces of the above type simultaneously with a suction force which nevertheless is prevented from breaking the workpieces.

Moreover, it is an object of the present invention to provide apparatus according to which it becomes possible for an operator to set a plurality of such workpieces up for subsequent operations to be performed automatically thereon while the latter operations are going forward on a previously handled group of workpieces.

In particular, it is an object of the present invention to provide an apparatus which is simple to operate in an extremely convenient manner for the purpose of transporting a relatively large number of workpieces of the above type from one location to another.

Furthermore, it is a particular object of the present invention to provide apparatus which will enable semiconductor substrates to be conveniently handled in connection with grinding operations which are carried out on a circular upright precision grinding machine.

According to the invention the machine which is to perform operations simultaneously on a plurality of workpieces such as semiconductor substrates includes a working station where the operations are simultaneously performed on the plurality of workpieces while they are situated at the working station in a common working plane respectively at predetermined locations in this plane. A positioning means is provided for preliminarily positioning the plurality of workpieces in a common positioning plane respectively at locations in this positioning plane which have with respect to each other the same relationship as the predetermined locations in the working plane. A transfer means is provided for transferring the workpieces from the locations in the positioning plane respectively to the locations in the working plane while maintaining the workpieces during their transfer in a common plane which moves with the workpieces and which at the beginning of the transfer coincides with the positioning plane while at the end of the transfer it coincides with the working plane, and the transfer means is capable of maintaining the workpieces in this common plane at the locations which respectively have with respect to each other the same relationship as the locations in the positioning plane and the working plane. Thus, according to the invention a plurality of semiconductor substrates are first situated in a common positioning plane at predetermined locations therein. Then these substrates are simultaneously transferred away from the positioning plane while being maintained in a common moving plane parallel to the positioning plane and at locations in the common plane which have with respect to each other the same relationship as the locations in the positioning plane. These semiconductor substrates are deposited, while still in this common plane, simultaneously in a predetermined working plane which coincides with the common plane at the end of the transfer step, respectively at locations in the working plane which have with respect to each other the same relationship as the locations in the positioning plane.

BRIEF DESCRIPTION OF DRAWINGS

The invention is illustrated by way of example in the accompanying drawings which form part of this application and in which.

DESCRIPTION OF PREFERRED EMBODIMENTS

Figure 1:
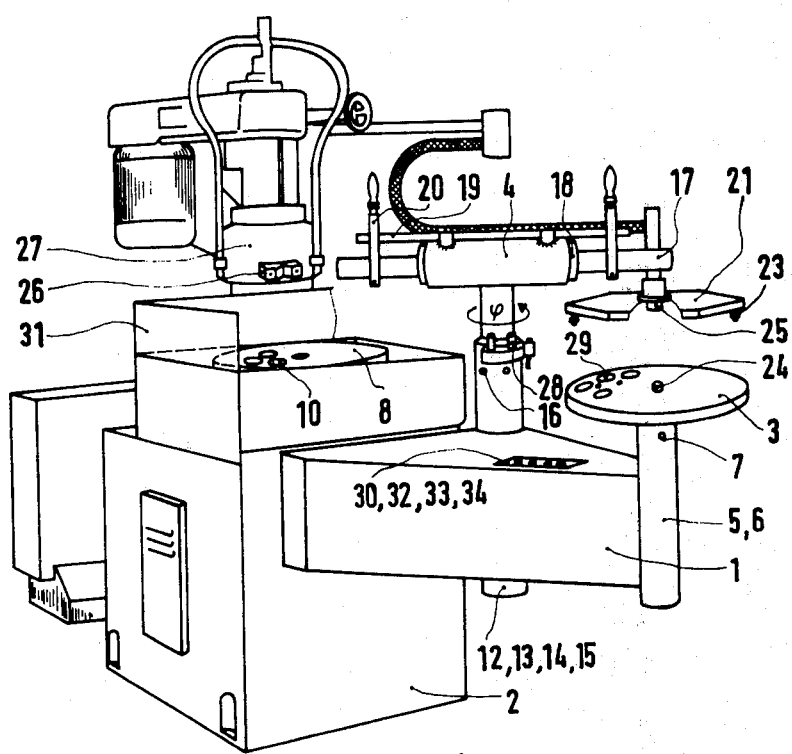
FIG. 1 is a simplified schematic elevation showing in perspective one embodiment of an apparatus of the invention combined with a circular surface grinding machine.

Referring to FIG. 1, there is schematically shown therein a precision grinder of a known construction capable of carrying out grinding operations in a precision manner in a horizontal plane so that precise surface grinding operations can be carried out with such a machine. This machine has a base 2 fixed with a mounting means 1 in the form of any suitable robust structural unit fixed to and projecting from the base 2 in the manner apparent from FIG. 1. This mounting unit 1 may, for example, be fixedly bolted to the base 2 and serves to mount at the grinding machine a positioning means 3 as well as a transfer means 4. The positioning means 3 takes the form of a horizontal circular plate, as is apparent from FIG. 1. In addition to this horizontal circular plate the positioning means includes an upright hollow sleeve 6 which receives in its interior a cylindrical column 5 fixed centrally to the bottom of the plate 3 and adjustable within the sleeve 6 which is fixed to the unit 1. A set screw 7 extends through the wall of the sleeve 6 into engagement with the column 5 so as to angularly fix the position of the circular plate which forms the positioning means 3.

The above structure enables the positioning means 3 to be situated in a plane parallel to a working plane formed by a component 8 of the machine, this component 8 being is the form of a circular support having means for holding the workpieces in position in a predetermined working plane by a force of suction which acts on the workpieces when they are in the working plane determined by the component 8 of the machine. Thus, it is possible by positioning the column 5 within the sleeve 6 to adjust a positioning plane formed by the positioning means 3 in such a way that the elevation of the positioning plane can be determined and also in such a way that the angular position of the plate 3 in the positioning plane can be determined, this positioning plane being parallel to the working plane and, if desired, at the same elevation as the working plane.

Figure 2:
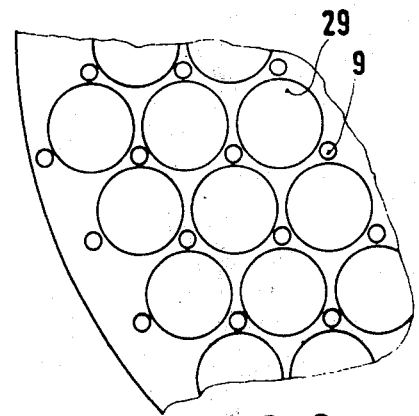
FIG. 2 is a fragmentary plan view of a positioning means shown with a plurality of circular substrates positioned thereon.

The positioning means includes in addition to the circular plate 3 which is illustrated in FIG. 1 a plurality of hardened steel pins 9 which are fixed to and project upwardly from the plate 3, so that these pins 9 serve to determine the locations of a relatively large number of semiconductor substrates or wafers 29 of circular configuration, as is shown most clearly in FIG. 2. The locations of the several workpieces in the positioning plane, as fragmentarily illustrated in FIG. 2, corresponds to the locations of porous ceramic inserts 10 carried by the plate 8 of the machine. Thus, the several porous ceramic inserts 10 have with respect to each other the same locations as the locations of the workpieces 29 as determined by the pins 9. These porous ceramic inserts 10 of the machine communicate through a hollow space in the support plate 8 with a source of vacuum so that when the workpieces are in the working plane they are held in this plane by suction which acts through the ceramic inserts 10. As is shown most clearly in FIG. 3, the plate 3 carries a plurality of relatively soft elastic bodies 11 which form supports for the several workpieces 29, respectively, so that these semiconductor substrates 29 which are to be subsequently ground will be protected by the soft, yieldable elastic supports 11 which may be made of a material such as a suitable rubber or the like. In this way the supports 11 protect the substrates 29 against damage when they are taken over by the transfer means 4 in a manner described below.

The transfer means 4 includes a column 13 movable vertically along and angularly about its upright axis while extending into a hydraulic cylinder 12 so that by way of hydraulic fluid under pressure it is possible to control the elevation of the column 13 which at the same time can be angularly turned as shown by the arrow in FIG. 1. This upright 13 is guided for vertical movement in a vertical tube 14 situated within a vertical sleeve 15, and adjusting screws 16 are provided to assure that the axis along which the column 13 can move and about which it can turn is precisely perpendicular to the parallel planes of the positioning means 3 and the work station 8.

At its upper end the column 13 carries a horizontal guide means in the form of a horizontal sleeve which has an axis perpendicular to the upright axis of the column 13, and an elongated horizontal arm 17 is slidable in the horizontal sleeve which forms a T-shaped unit with the column 13, the horizontal arm 17 thus being movable longitudinally along the horizontal axis which is perpendicular to the upright axis of the column 13. This horizontal arm 17 is surrounded by a pair of air bearings 18 at opposite ends of the guide sleeve, and air under pressure is supplied through the air bearings 18 to the exterior surface of the arm 17 only during actual horizontal movement of the arm 17. An elongated bar 19 is fixed to and extends along the top of the guide sleeve parallel to the horizontal axis of the latter, and upright handles are fixed to the arm 17 and engage opposed surfaces of the bar 19 so that in this way the arm 17 is prevented from turning about its axis. If desired there may be only two handles 20, as illustrated, these handles being formed with suitable openings which receive the bar 19 so that in this way the slidable movement of the handles 20 with respect to the bar 19 prevent the arm 17 from turning. In addition it will be noted that two separate rings form stops for limiting the extent of horizontal movement of the arm 17.

Figure 3:
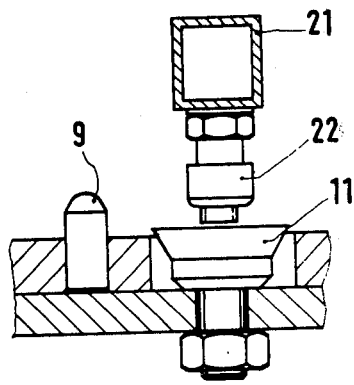
FIG. 3 is a fragmentary sectional elevation of part of a transfer means and part of the positioning means of FIG. 2.

The transfer means furthermore includes at the front end region of the horizontal support arm 17 a vertically adjustable plate means 21 made up of a number of aluminum tubes of square cross section which are joined together in a common horizontal plane in any suitable way, one of these tubes of the plate means 21 being visible in FIG. 3 in section. Through a flexible hose and the vertically adjustable hollow housing which is visible in FIG. 1 the interiors of the tubes which form the plate means 21 communicate with a source of suction as well as with a source of air at a pressure greater than atmospheric pressure. The plate means 21 carries a plurality of nozzles 22 the interiors of which communicate with the interior spaces of the square tubes, so that the interiors of the nozzles are in this way placed in communication with the source of suction and the source of air under pressure. The nozzles 22, one of which is visible in FIG. 3, have with respect to each other the same locations as the locations of the workpieces 29 shown in part in FIG. 2, and thus also of the locations of the several inserts 10. These nozzles 22 have lower free ends which are situated in a common plane and at the regions of their lower free ends the nozzles 22 are made of a soft tubular elastic material. The cross section of the tubular space surrounded by each nozzle 22 at the region where it engages a semiconductor substrate 29 has an area which is smaller than the area of the substrate 29 which is to be ground by approximately a factor of 100. In other words the cross section of the area through which suction is applied to the surface of a substrate 29 to hold it in engagement with the nozzle 22 is approximately 100th the area of the substrate 29. Thus, the several nozzles 22 are capable of holding and carrying the substrates 29 by way of a suction force without mechanically damaging the substrates 29 and without any danger of breaking the substrates as a result of the vacuum prevailing in the interior space of the nozzles 22.

The plate means 21 furthermore carries a plurality of stops 23 which project downwardly from the plate means at the peripheral region thereof and which serve to engage the top surface of the plate which forms the positioning means 3 so as to situate in this way the lower ends of the nozzles 22 at a proper distance from the plate of the positioning means 3 to assure engagement of the soft elastic bottom free ends of the nozzles 22 with the workpieces 29 without unduly pressing the latter against the elastic supports 11 so that a reliable engagement of the workpieces without danger of breaking the same is achieved in this way. These stops 23 serve the same purpose in connection with deposition of the workpieces 29 on the inserts 10 at the end of the transfer operation, the stops 23 cooperating with the plate 8 at this time.

Moreover, the circular plate which forms the positioning means 3 fixedly carries at its center an indexing and centering pin 24 received in the interior of a corresponding sleeve 25 situated at the center of the plate means 21 of the transfer means 4. Thus, the pin 24 may be of a non-circular cross section received in a bore of the sleeve 25 which is of a mating non-circular cross section so that in this way not only is centering of the plate means 21 with respect to the plate 3 assured but also proper angular positioning of the plate means 21 with respect to the plate 3 is assured.

Furthermore, it is to be noted that the plate means 21 is of a non-circular cross section having a polygonal periphery mounted on a hollow housing which is capable of being received with its upper end in a prism of a stop 26, so that by situating the upper end of this hollow housing in the prism of the stop 26 the plate means 21 is properly positioned over the circular support 8 of the grinding machine. The stop 26 is mounted on the wheel guard 27 which has in its interior the horizontal grinding disc. Thus, by way of the element 26 proper positioning of the several workpieces 29 directly over the inserts 10 at the predetermined locations in the working plane is assured, and of course by way of the components 24 and 25 the proper positioning of the nozzles 22 with respect to the locations of the workpieces 29 in the positioning plane of the positioning means 3 is also assured. The positioning means 4 is of course capable of being angularly turned for example through an angle $\phi$ of approximately 300°, and a suitable stop means 28 may be provided for adjustably limiting the angle of turning of the column 13 and the remainder of the transfer means so that through such an adjustable stop means 28 it is possible to provide for the transfer means angular end positions at one of which the plate 21 is situated directly over the positioning means 3 and at the other of which the plate 21 is situated outside of the machine for unloading and initial position.

Suitable control switches are centrally situated at the mounting means 1. These switches include a switch 30 which controls the opening and closing of a splashguard 31 which protects against water spray during the grinding operation, while a switch 32 is available for controlling the hydraulic raising and lowering of the column 13 with the remainder of the transfer means 4. A switch 33 is available for controlling the flow of fluid such as air both at less than and more than atmospheric pressure so as to control the engagement and disengagement of the workpieces from the nozzles 22, and there is also a control lamp 34.

The above-described structure of the invention operates as follows:

The semiconductor wafers or substrates of circular configuration in the form of relatively thin delicate plates are placed by hand on positioning means 3 in the positioning plane at predetermined locations therein as illustrated fragmentarily in FIG. 2. In this way each wafer or substrate is supported on an elastic support 11 while having its location determined by the steel pins 9. The arrangement of the locations of the workpieces 29 as illustrated in FIG. 2 is such that these locations have with respect to each other precisely the same relationship as the locations of the inserts 10 in the working plane.

Now the column 13 is raised hydraulically from its initial position so that the transfer means 4 is raised in this way, and the column 13 together with the remainder of the transfer means 4 is turned angularly about the upright axis of the column 13 until one end position is determined by the stop structure 28, and in this end position the plate means 21 is situated directly over the positioning means 3. With the transfer means in this position, the transfer means is hydraulically lowered and the index pin 24 is received in the sleeve 25 while the stops 23 engage the periphery of the plate 3 so that the position of the plate means 21 with respect to the plate 3 is precisely determined both in elevation and angularly. As a result the nozzles 22 are precisely positioned over the centers of the several semiconductors substrates 29, respectively.

Now the vacuum is turned on by way of a hydraulically controlled valve so that less than atmospheric pressure prevails throughout the hollow interior spaces of the plate means 21, and the substrates 29 are thus drawn by suction against the soft elastic lower free end portions of the nozzles 22 to be firmly held thereby.

Now, with the suction remaining in the nozzles 22, the transfer means 4 is again hydraulically raised, after which the transfer means 4 is swung around the upright axis of the column 13 until the hollow housing of the plate means 21 is determined by the stop structure 28, and at this time the periphery of the hollow housing of the plate means 21 is received in the V-notch of the stop 26 carried by the protective cover 27 as described above. With the transfer means thus positioning the plate means 21 precisely over the plate 8 at the working station, the transfer means is again hydraulically lowered, so that now the stops 23 cooperate with the plate 8 for positioning the plate 21 at precisely the right elevation with respect to the plate 8, and now the several substrates 29 will be precisely positioned over the several porous ceramic inserts 10.

The porous ceramic inserts 10 are now placed in communication with the source of suction while the communication of the nozzles 22 with the source of suction is terminated, with the result that the substrates 29 are now held by the suction against the ceramic inserts 10 to be firmly held thereby at the predetermined locations in the working plane. In order to facilitate the release of the substrates 29 from the nozzles 22 when the substrates 29 have thus been situated at the working plane, when the suction of the nozzles 22 is terminated these nozzles 22 are immediately placed in communication with a source of air under pressure so that now through the nozzles 22 the substrates are urged toward the inserts 10 which simultaneously communicate with a source of suction. Thus a reliable release of the substrates 29 from the nozzles 22 is assured, and now the transfer means 4 is again hydraulically raised, angularly turned toward its initial angular position and then lowered to its initial position. Now the splashguard 31 is closed and the automatic operating cycle of the grinding machine is started.

When the program of operation of the grinding machine has been completed, the machine returns to its initial position where the table of the machine remains at a predetermined location and the operation at the vacuum-holding plate 8 is terminated.

The transfer means 4 is again hydraulically raised from its rest position, and the plate means 21 is again placed in engagement with the positioning stop 26 at the wheel guard 27 after which the transfer means is lowered. Now the nozzles 22 are again placed in communication with the source of vacuum while at the same time water and air at greater than atmospheric pressure are provided in the suction conduits of the vacuum-holding plate 8, so that in this way the movement of the semiconductor wafers against the suction nozzles 22 is reinforced by the fluid under pressure at the inserts 10. Thus, the substrates 29 on which the operations have been performed are now held by suction against the nozzles 22 and the transfer means 4 is now raised and turned to a location which will situate the substrates over a washing and cleaning station. The vacuum is now turned off and a reversal of the suction stream results in a blowing action which discharges the substrates 29 from the suction nozzles 22 into the cleaning container.

After the vacuum-holding plate 8 is cleaned the above cycle of operations can be repeated. During the grinding operations which are going forward at the machine it is possible for substrates 29 for the next cycle of operations to be placed on the positioning means 3, so that as soon as one cycle of operations is completed by the machine, the next group of substrates is in readiness at the positioning plane to be transferred by the transfer means of the invention to the working station.

Of course it is to be noted that the apparatus of the invention need not be used only in combination with a grinding machine. Further possibilities of use of the method and apparatus of the invention are, for example, supply and discharge of delicate workpieces at measuring stations, cleaning stations, coating stations, and treatment of workpieces such as semiconductor substrates in connection with masking and exposure to vapor deposition, for example, so that in general any transport problems in connection with workpieces of this type is suitable for the present invention.

It is to be noted that the support of the several workpieces on the soft yieldable elastic supports 11 serve not only to protect the workpieces but also to compensate for any variations in the thickness of the workpieces. The same is of course true of the soft yieldable elastic free ends of the nozzles 22.

Moreover, the provision of cross-sectional areas for the nozzles which are on the order of 100th the area of the surface of the semiconductor workpiece is of great significance since with such a ratio of the area of the nozzle to the area of the workpiece there is on the one hand an assurance of a reliable holding of the workpiece at the nozzle by suction while on the other hand there is no danger of injuring the workpiece as a result of the force of the suction. This danger of breaking a semiconductor wafer by the action of vacuum is present when the diameter of the suction nozzle is too great, since in this case in the free suction space of the nozzle the semiconductor wafer can be bent by the force of suction and can even become fractured in this way.

What is claimed is:

1. In a machine for performing operations simultaneously on a plurality of workpieces such as semiconductor substrates, the machine having a working station where the operations are simultaneously performed on the plurality of workpieces while they are situated at the work station in a common working plane respectively at predetermined locations in said plane, positioning means for preliminarily positioning the plurality of workpieces in a common positioning plane respectively at locations in said positioning plane which have with respect to each other the same relationship as said predetermined locations in said working plane, and transfer means for transferring the workpieces from said locations in said positioning plane respectively to said locations in said working plane while maintaining the workpieces during transfer thereof from said positioning plane to said working plane in a common plane which moves with the workpieces and which at the beginning of transfer coincides with said working plane, while maintaining the workpieces in said common plane at locations, respectively, which have with respect to each other the same relationship as said locations in said positioning plane and said locations in said working plane, said transfer means including a plurality of nozzles respectively situated at said locations in said common plane for respectively engaging the workpieces at said locations in said positioning plane, and means operatively connected with said nozzles for applying suction thereto for respectively holding the workpieces in engagement with said nozzles by suction during transfer of the workpieces from said positioning plane to said working plane, a base situated beneath said work station, mounting means mounting said transfer means and said positioning means on said base, and said transfer means including an upright vertically movable along and turnable angularly about a predetermined upright axis, horizontal guide means carried by said upright at an upper end thereof, an elongated horizontal arm guided by said guide means for movement back and forth along a horizontal axis perpendicular to said upright axis, and plate means carried by said horizontal arm and carrying said nozzles, said working plane, positioning plane, and common plane all being horizontal so that said plate means and nozzles can be freely moved by movement of said arm along said horizontal axis and said upright along and around said vertical axis for placing said nozzles first in engagement with the workpieces at said positioning plane and for then transferring the workpieces to said working plane.

2. The combination of claim 1 and wherein said means which is operatively connected with said nozzles also cooperates therewith for applying to said nozzles a pressure greater than atmospheric pressure when the workpieces arrive at said working plane for separating the workpieces from said nozzles at said working plane.

3. The combination of claim 1 and wherein said positioning means includes a plurality of elastic yieldable supports respectively situated at said locations of said positioning plane for supporting the workpieces.

4. The combination of claim 1 and wherein said nozzles are made of an elastic yieldable material at least at free end regions of said nozzles which directly engage the workpieces.

5. The combination of claim 4 and wherein each nozzle has a cross section which is smaller than the area of a workpiece on which operations are to be performed by approximately a factor of 100.

6. The combination of claim 1 and wherein said plate means has hollow interior spaces communicating with said nozzles and with which said means for applying suction communicates.

* * * * *